United States Patent [19]

Sato et al.

[11] Patent Number: 4,839,399

[45] Date of Patent: Jun. 13, 1989

[54] ACTIVE ENERGY BEAM-CURABLE TYPE RESIN COMPOSITION

[75] Inventors: Yasufumi Sato; Megumi Munakata; Hiromichi Noguchi, all of Atsugi, Japan

[73] Assignee: Canon Kabushiki Kaisha, Tokyo, Japan

[21] Appl. No.: 22,052

[22] Filed: Mar. 5, 1987

[30] Foreign Application Priority Data

Mar. 10, 1986 [JP] Japan ................... 61-50559

[51] Int. Cl.$^4$ .................... C08F 265/06
[52] U.S. Cl. ..................... 522/14; 522/33; 522/36; 522/43; 522/46; 522/48; 522/59; 522/63; 522/68; 522/77; 522/92; 522/95; 522/102; 522/106; 522/121; 525/279; 525/289; 525/290
[58] Field of Search ............... 525/289, 290, 910, 913, 525/279; 522/92, 102, 14, 36, 43, 46, 48, 63, 33, 59, 68, 77, 121, 106, 95; 156/273.3; 346/140 R

[56] References Cited

U.S. PATENT DOCUMENTS

| | | | |
|---|---|---|---|
| 3,711,575 | 1/1973 | Kakefuda | 525/290 |
| 4,333,963 | 6/1982 | Emmons | 522/103 |
| 4,412,896 | 11/1983 | Lemattre | 525/289 |
| 4,554,322 | 11/1985 | Kwiecinski | 525/290 |
| 4,688,054 | 8/1987 | Inamoto | 346/140 |

FOREIGN PATENT DOCUMENTS

| | | | |
|---|---|---|---|
| 7247865 | 2/1972 | Japan | 525/289 |
| 0087409 | 5/1982 | Japan | 522/92 |

*Primary Examiner*—John C. Bleutge
*Assistant Examiner*—David Buttner
*Attorney, Agent, or Firm*—Fitzpatrick, Cella, Harper & Scinto

[57] ABSTRACT

An active energy beam-curable type resin composition, which comprises (A) a graft copolymer comprising a main chain composed mainly of structural units of monomers containing one (meth)acryloyl group and a dicyclopentenyl derivative group represented by the following general formula (I):

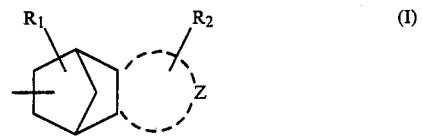

wherein Z represents a five-membered ring given by

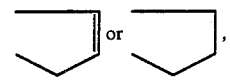

and $R_1$ and $R_2$ represent halogen atoms or alkyl groups having 1 to 3 carbon atoms, in one molecule, and at least one monomer selected form the group consisting of alkyl(meth)acrylate, acrylonitrile, and styrene, and side chains composed mainly of at least one monomer selected from the group consisting of (a) hydroxyl group-containing (meth)acryl monomer, (b) amino or alkylamino group-containing (meth)acryl monomer, (c) carboxyl group-containing (meth)acryl or vinyl monomer, (d) N-vinylpyrrolidone, (e) vinylpyridine or its derivatives, and (f) a (meth)acrylamide derivative represented by the following general formula (II), as added to the main chain:

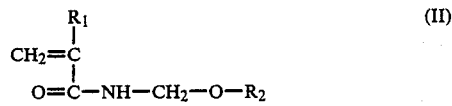

wherein $R_1$ represents a hydrogen atom or a methyl group, and $R_2$ represents a hydrogen atom or a hydroxyl group-containing alkyl having 1 to 4 carbon atoms or acyl group; and (B) a monomer having an ethylenic unsaturated bond.

18 Claims, No Drawings

ACTIVE ENERGY BEAM-CURABLE TYPE RESIN COMPOSITION

BACKGROUND OF THE INVENTION

1. Field of the Invention

This invention relates to a resin composition curable by irradiation with an active energy beam such as ultraviolet rays, electron beams, etc., and particularly to an active energy beam-curable type resin composition capable of forming a pattern having a good adhesiveness to a support of glass, ceramics, or plastic film, a good resistance to chemicals, a distinguished heat resistance, and a good mechanical strength. The active energy beam-curable type resin composition can be molded into a solid sheet (dry film) of photosensitive member.

2. Related Background Art

Recently, the active energy beam-curable type resin composition has been widely used in the fields of paint, ink, sealing materials, resist materials, and pattern-forming materials. The active energy beam-curable type resin composition as pattern-forming materials was used to prepare printing plates, etc. in the initial period, and recently has been utilized in the field of the electronic industry such as print circuit, integrated circuit, etc. and also utilized as structural materials for elements such as fluid logical elements as disclosed in Japanese Patent Application Kokai (Laid-open) No. 43876/1982.

However, the active energy beam-curable type resin composition so far known and used for the pattern formation, particularly dry film type, has no better adhesiveness to a support of glass, ceramics, plastic film or the like.

On the other hand, the so far known photo-curable type paints or adhesives applicable to glass, metal, or ceramics can give cured products with a distinguished adhesiveness, but require irradiation of stronger active energy beam, or prolonged irradiation (exposure) time for the curing, and usually have no properties suitable for the pattern formation. That is, even if they are used to obtain patterns by exposing the patterns to irradiation with an active energy beam and removing the unexposed parts through development, no precise patterns with a high resolution can be obtained. In the prior art, there have been no such active energy beam-curable type resin composition that can form, on various supports, a precise pattern having a high durability as a structural material.

SUMMARY OF THE INVENTION

An object of the present invention is to provide an active energy beam-curable type resin composition capable of forming a precise pattern with a high resolution and with a good adhesiveness to a support, a good resistance to chemicals, a good heat resistance, and a high mechanical strength that cannot be attained by the conventional active energy beam-curable type resin composition.

According to the present invention, there is provided an active energy beam-curable type resin composition, which comprises (A) a graft copolymer comprising a main chain composed mainly of structural units of monomers containing one (meth)acryloyl group and a dicyclopentenyl derivative group represented by the following general formula (I):

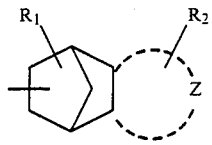

wherein Z represents a five-membered ring given by

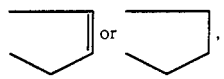

and $R_1$ and $R_2$ represent hydrogen atoms or alkyl groups having 1 to 3 carbon atoms, in one molecule, and at least one monomer selected from the group consisting of alkyl(meth)acrylate, acrylonitrile, and styrene, and side chains composed mainly of at least one monomer selected from the group consisting of (a) hydroxyl group-containing (meth)acryl monomer, (b) amino or alkylamino group-containing (meth)acryl (c) carboxyl group-containing (meth)acryl or vinyl monomer, (d) N-vinylpyrrolidone, (e) vinylpyridine or its derivatives, and (f) a (meth)acrylamide derivative represented by the following general formula (II), as added to the main chain:

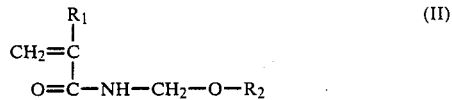

wherein $R_1$ represents a hydrogen atom or a methyl group, and $R_2$ represents a hydrogen atom or a hydroxyl group-containing alkyl having 1 to 4 carbon atoms or acyl group; and (B) a monomer having an ethylenic unsaturated bond.

DETAILED DESCRIPTION OF THE INVENTION

The present invention will be described in detail below.

The terms "(meth)acryloyl group", "(meth)acrylate" and "(meth)acryl" include the terms "acryloyl group and methacryloyl group", "acrylate and methacrylate", and "acryl and methacryl", respectively, throughout the present specification.

In the present active energy beam-curable type resin composition, the graft copolymer (A) as the essential component in prepared by grafting a relatively rigid, highly heat-resistant main chain suitable as a structural material with side chains composed mainly of the said hydrophilic monomers (a) to (f) and having a good adhesiveness to a support.

The dicyclopentenyl (meth)acrylate derivative as the essential component for constituting the main chain of the said graft copolymer has a very high glass transition point and a low moisture absorption and gives a high heat resistance and a good durability to the present composition.

Specifically, compounds with the following structures can be enumerated:

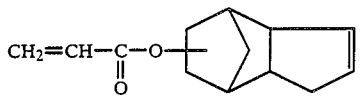

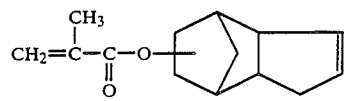

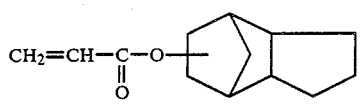

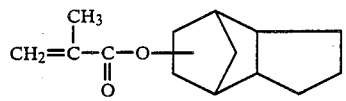

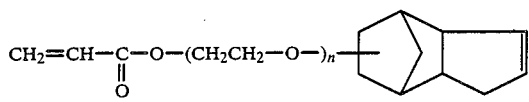

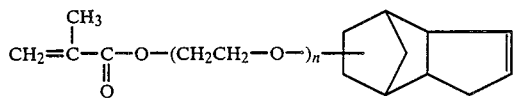

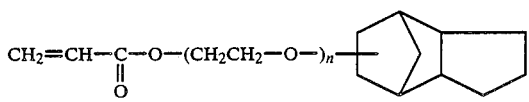

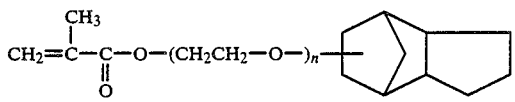

A mixing ration of the dicyclopentenyl(meth) acrylate derivative is preferably 1% to 60% by weight on the basis of total monomers, and particularly preferably in the range of 1% to 30% by weight when the resin composition is used for a dry film.

Another monomer constituting the main chain of graft copolymer includes, for example, alkyl(meth)acrylates whose alkyl groups have 1 to 4 carbon atoms, such as methyl(meth)acrylate, ethyl(meth)acrylate, isobutyl(meth) acrylate, t-butyl(meth)acrylate, etc., acrylonitrile and styrene.

The main chains include not only those composed only of the said monomers, but also those composed of the said monomers and 0% to about 50% by weight of methyl (meth)acrylate, ethyl(meth)acrylate, n-butyl(meth) acrylate, lauryl(meth)acrylate, 2-ethylhexyl(meth) acrylate, glycidyl(meth)acrylate, vinyl acetate, etc. as comonomer. The said main chain can give a high cohesion strength and a high heat resistance to the present composition.

Monomers constituting the side chains of the present graft copolymer will be given in detail below.

The hydroxyl group-containing (meth)acryl monomers given as (a) include:
2-hydroxyethyl(meth)acrylate,
2-hydroxypropyl(meth)acrylate,
3-chloro-2-hydroxypropyl(meth)acrylate,
4-hydroxybutyl(meth)acrylate,
3-hydroxybutyl(meth)acrylate,
5-hydroxpentyl(meth)acrylate,
6-hydroxyhexyl(meth)acrylate,
monoester of 1,4-cyclohexanedimethanol and (meth)acrylic acid, etc.

Those known as Aronix M5700 (trademark of a product made by Toa Gosei Kagaku K.K., Japan), Tone M100 (trademark of caprolactone acrylate, made by Union Carbide, Inc., U.S.A.), Light Ester HO-mpp (trademark of a product made by Kyoeisha Yushi Kagaku Kogyo K.K., Japan), Light Ester N-600A (trademark of 2-hydroxy-3-phenoxypropyl acrylate, made by Kyoeisha Yushi Kagaku Kogyo K.K., Japan) or monoesters of dihydric alcohols such as 1,10-decanediol, neopentylglycol, bis(2-hydroxyethyl)-terephthalate, adducts of bisphenol A and ethylene oxide or propylene oxide, etc. with (meth)acrylic acid, etc. can be used.

The amino or alkylamino group-containing(meth)acrylmonomers given as (b) include:
(meth)acrylamide,
N,N-dimethylaminoethyl(meth)acrylamide,
N,N-dimethyl(meth)acrylamide,
N,N-dimethylaminopropyl(meth)acrylamide,
N,N-di-t-butylaminoethyl(meth)acrylamide, etc.

The carboxyl group-containing (meth)acryl or vinyl monomers given as (c) includes (meth)acrylic acid, fumaric acid, itaconic acid, those known with trademarks Aronix M-5400, Aronix M-5500, etc. (products made by Toa Gosei Kagaku K.K., Japan)

N-vinylpyrrolidone given as (d).

The vinylpyridine or its derivatives given as (e) include:
2-vinylpyridine,
4-vinylpyridine,
2-vinyl-6-methylpyridine,
4-vinyl-1-methylpyridine,
2-vinyl-5-ethylpyridine,
4-(4-piperininoethyl)pyridine, etc.

All the monomers given as said (a) to (d) and (e) are hydrophilic and give a strong adhesiveness to the present composition, when bonded to a support of glass, ceramics, plastics or the like.

The (meth)acrylamide derivatives represented by the general formula (II) and given as (f) include hydrophilic and heat cross-linkable monomers such as:
N-methylol(meth)acrylamide,
N-propoxymethyl(meth)acrylamide,
N-n-butoxymethyl(meth)acrylamide,
β-hydroxyethoxymethyl(meth)acrylamide,
N-ethoxymethyl(meth)acrylamide,
N-methoxymethyl(meth)acrylamide, etc.

These monomers (f) have not only the hydrophilic property, but also the condensation cross-linkability by heating, and generally release the water molecule or alcohol at a temperature of 100° C. or higher to form a cross-linkage. That is, a network structure is formed in the graft copolymers themselves after the curing, thereby more improving the chemical resistance and mechanical strength of a pattern obtained by the curing. That is, the present invention is rendered more effective thereby.

By adding some of cross-linkable monomers capable of undergoing ring opening by heat to the said monomers (a)–(f), such as glycidyl(meth)acrylate, etc., thereby forming side chains, the similar effects to those obtained with the said monomers (f) can be also obtained.

Besides the said heat cross-linking, it is also effective for the same purpose to introduce a photopolymerizable monomer to some of side chains of the present graft copolymers and cross-link the graft copolymers by an active energy beam.

The photopolymerizability can be given to the side chains, for example:

(a) by copolymerizing with a carboxyl group-containing monomer represented by (meth)acrylic acid, etc., or an amino group- or t-amino group-containing monomer, and then by reacting with glycidyl(meth)acrylate, etc.;

(b) by reacting a compound having one isocyanate group and at least one (meth)acryl ester group in one molecule with the hydroxyl group, amino group, or carboxyl group of the side chain;

(c) by reacting the hydroxyl group of the side chain with (meth)acryloyl chloride;

(d) by reacting the hydroxyl group of the side chain with an acid anhydride, and then by reacting with glycidyl(meth)acrylate;

(e) by condensing the hydroxyl group of the side chain with a condensation cross-linkable monomer given in the said (f), retaining the (meth)acrylamido group as the side chain;

(f) by reacting the hydroxyl group of the side chain with glycidyl(meth)acrylate; and the like.

When the side chain of the present graft copolymers is heat cross-linkable, it is preferable to carry out heating after the formation of a pattern by irradiation with an active energy beam. When the side chain is photopolymerizable on the other hand, it is also not objectionable or rather effective to carry out the heating within an acceptable range with respect to the heat resistance of the support.

The side chain is not only those derived from the hydrophilic monomers given in the said (a)–(f), but also those derived from various hydrophobic monomers having various functions within the range of 0% to about 25% by weight as a comonomer.

The present graft copolymers can be classified into the following groups: an incurable group, a photo cross-linkable group and a heat cross-linkable group, and any of the present graft copolymers can give the present composition a form retainability in the step of hardening the present composition (that is, in the step of irradiation with an active energy beam and, if necessary, heat hardening), thereby enabling a precise patterning and also can give a distinguished adhesiveness, a good chemical resistance, and a high mechanical strength to the pattern obtained by the hardening.

The said graft copolymers applicable to the present composition can be prepared according to known processes, for example, various processes disclosed in "Polymer Alloy, Basis and Applications" pages 10 to 35, compiled by Kobunshi Gakkai and published by Tokyo Kagaku Dojin K.K. (1981), such as (1) a chain transfer process, (2) a process with radiation, (3) an oxidative polymerization process, (4) an ion graft polymerization process, and (5) a macromonomer process.

The surfactant effect is more pronounced when the side chains of the present graft copolymers have a uniform length, and thus the processes (4) and (5) are preferable to use. Above all, the macromonomer process (5) is particularly preferable and advantageous with respect to the material design. The weight-average molecular weight of the present copolymers is preferably in the range of about 5,000 to about 300,000, and particularly preferably in the range of about 30,000 to about 300,000 when used as a dry film.

The monomer (II) having an ethylenic unsaturated bond as another component for the present composition is a component capable of giving a curability by an active energy beam, preferably a monomer having a boiling point of 100° C. or higher under the atmospheric pressure and at least two ethylenic unsaturated bonds. Various known monomers curable by irradiation with an active energy beam can be used.

The monomers having at least two ethylenic unsaturated bonds can include, for example:

(a) (Meth)acrylic acid esters of polyfunctional epoxy resin having at least two epoxy groups in one molecule, (b) (meth)acrylic acid esters of adduct of alkylene oxide and polyhydric alcohol, (c) Polyester(meth)acrylate having a (meth)acrylic acid ester group at the molecular chain terminal of polyester having a molecular weight of 500 to 3,000, composed of a dibasic acid and a dihydric alcohol, and (d) reaction products of a multivalent isocyanate and a (meth)acrylic acid monomer having a hydroxyl group. The said monomers (a)–(d) may be urethane-modified ones having a urethane bond in the molecule.

The monomers (a) include for example, (meth)acrylic acid esters of epoxy resins represented by bisphenol A type, novolak type, alicyclic type, bisphenol S type and bisphenol F type, tetrahydroxyphenylmethanetetraglycidyl ether, resorcinolglycidyl ether, glycerine triglycidyl ether, pentaerythritol triglycidyl ether, isocyanuric acid triglycidyl ether, and epoxyurethane resin represented by the following general gormula (III):

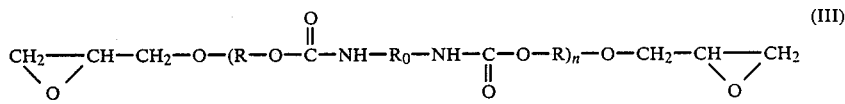

wherein R is an alkyl group or an oxyalkyl group and $R_0$ is

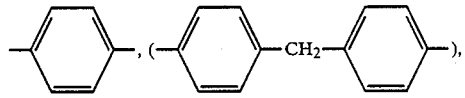

or an alkyl group).

The monomers (b) include, for example, ethyleneglycol di(meth)acrylate, diethyleneglycol di(meth)acrylate, polyethyleneglycol di(meth)acrylate, 1,6-hexanediol di(meth)acrylate, polyethyleneglycol di(meth)acrylate, pentaerythritol tri(meth)acrylate, etc., and KAYARAAR HX-220, HX-620, D-310, D-320, D330, DPHA, R-604, DPCA-20, DPCA-30, DPCA-60, and DPCA-120 (trademarks of products made by Nihon Kayaku K.K., Japan); NK Ester BPE-200, BPE-500, BPE-1300, and A-BPE-4 (trademarks of products made by Shin-Nakamura Kagaku K.K., Japan), etc. can be used.

The monomers (c) include, for example, Aronix M-6100, M-6200, M-6300, M-6400, M-7100, M-8030, M-8060, and M-8100 (trademarks of products made by Toa Gosei Kayaku K.K., Japan), etc.

The monomers (b) having a urethane bond in the polyester include, for example, those known as Aronix M-1100 and Aronix M-1200 (trademarks of products made by Toa Gosei Kagaku K.K., Japan), etc.

The monomers (d) include, for example, reaction products of a polyisocyanate such as tolylenediisocyanate, isophoronediisocyanate, hexamethylenediisocyanate, trimethylhexamethylenediisocyanate, lysinediisocyanate, diphenylmethanediisocyanate, etc. and a hydroxyl groupcontaining (meth)acryl monomer, and the addition reaction products of polyisocyanate compounds known as Sumijur N (trademark of biuret derivative of hexamethylenediisocyanate made by Sumitomo-Bayer Urethane K.K., Japan) Sumijur L (trademark of trimethylolpropanemodified product of tolylene-diisocyanate made by Sumitomo-Bayer Urethane K.K., Japan), etc. with a hydroxyl group-containing (meth)acrylic acid ester can be used. The hydroxyl group-containing (meth)acryl monomers are preferably hydroxyethyl(meth)acrylate and hydroxypropyl(meth)acrylate. Furthermore, other hydroxyl group-containing (meth)acryl monomers enumerated before as applicable to the side chain of the present graft copolymer can be also used.

Besides the said monomers having at least two ethylenic unsaturated bonds, the following nomomers having only one ethylenic unsaturated bond can be used together with the said monomers.

The monomers having only one ethylenic unsaturated bond include, for example, carboxyl group-containing, unsaturated monomers such as (meth)acrylic acid, etc.; glycidyl group-containing unsaturated monomers such as glycidyl (meth)acrylate, etc.; $C_2$–$C_8$ hydroxyalkyl esters of (meth)acrylic acid such as hydroxyethyl(meth)acrylate, hydrroxypropyl(meth)acrylate, etc.; monoesters of (meth)acrylic acid and polyethyleneglycol or polypropyleneglycol such as polyethyleneglycol mono(meth)acrylate, polypropyleneglycol mono(meth) acrylate, etc.; $C_1$–$C_{12}$ alkyl or cycloalkyl ester of (meth)acrylic acid such as methyl(meth)acrylate, ethyl (meth)acrylate, propyl(meth)acrylate, isopropyl(meth) acrylate, butyl(meth)acrylate, hexyl(meth)acrylate, octyl(meth)acrylate, lauryl(meth)acrylate, cyclohexyl (meth)acrylate, etc. Other monomers include, for example, styrene, vinyltoluene, methylstyrene, vinyl acetate, vinylisobutyl ether, acrylonitrile, (meth) acrylamide, (meth)acrylic acid adduct of alkylglycidyl ether, vinylpyrrolidone, dicyclopentenyloxyethyl (meth)acrylate, ε-caprolactone-modified hydroxyalkyl (meth)acrylate, tetrahydrofurfuryl(meth)acrylate, phenoxyethyl(meth)acrylate, etc.

By using the said monomers having an ethylenic unsaturated bond, the present composition can be given a curability by an active energy beam.

The active energy beam for curing the active energy beam-curable type resin composition according to the present invention includes, for example, so far widely and practicably utilized ultraviolet rays, electron beams, etc. The source for the ultraviolet rays includes a high pressure mercury lamp, a ultra-high pressure mercury lamp, a metal halide lamp, etc. emitting much lights having a wavelength of 250 nm–450 nm, and a preferable lamp is the one emitting a light having a light intensity of about 1 mW/cm$^2$ to about 100 mW/cm$^2$ and a wavelength of about 365 nm within a practicably acceptable distance between the lamp and a subject. The apparatus for electron beam irradiation is not particularly limited, but a practicably preferable apparatus is the one having a dosage ranging from 0.5 to 20 M Rad.

The present active energy curable-type resin composition can be cured by the said active energy beam, and in case of using an active energy beam having a wavelength of 250 nm to 450 nm, it is preferable to add a photopolymerization initiator to the resin composition. As the photopolymerization initiator, any of well known ones applicable to the photopolymerization can be used. The photopolymerization initiator includes, for example, dibenzoyl and its derivatives; benzoin alkyl ethers such as benzoinisobutyl ether, benzoinisopropyl ether, benzoin-n-butyl ether, benzoinethyl ether, benzoinmethyl ether, etc.; benzophenones such as benzophenone, 4,4'-bis(N,N-diethylamino) benzophenone, benzophenonemethyl ether, etc.; anthraquinones such as 2-ethylanthraquinone, 2-t-butylanthraquinone, etc.; xanthones such 2,4-dimethylthioxanthone, 2,4-diisopropylthioxanthone, etc.; and acetophenones such as 2,2-dimethoxy-2-phenylacetophenone, αα-dichloro-4-phenoxyacetophenone, p-tert-butyltrichloroacetophenone, p-tert.-butyldichloroacetophenone, 2,2-diethoxyacetophenone, p-dimethylaminoacetophenone, etc. Furthermore, hydroxycyclohexylphenylketone (Irgacure 184, trademark of a product made by Ciba-Geigy A.G.), 1-(4-isopropylphenyl)-2-hydroxy-2-methylpropane-1-on (Darocure 1116, trademark of a product made by Merck & Co., Inc.), 2-hydroxy-2-methyl-1-phenyl-propane-1-on (Darocure 1173, trademark of a product made by Merck & Co., Inc.), etc. can be preferably used. In addition to the photopolymerization initiator, an amino compound may be added to the said resin composition as a photopolymerization promoter.

The amino compound to be used as the photopolymerization promoter includes, for example, ethanolamine-ethyl-4dimethylaminobenzoate, 2-(dimethylamino) ethylbenzoate, p-dimethylaminobenzoic acid n-aminoester, p-dimethylaminobenzoic acid isoamyl ester, etc.

The present active energy beam-curable type resin composition comprises 20 to 80 parts by weight, preferably 20 to 50 parts by weight of the graft copolymer and 80 to 20 parts by weight, preferably 80 to 50 parts by weight of the monomer having an ethylenic unsaturated bond. When the photopolymerization is used, 0.1 to 20 parts by weight, preferably 1 to 10 parts by weight, of the photopolymerization initiator is used on the basis of 100 parts by weight of the resin composition composed of the graft copolymer and the monomer having an ethylenic unsaturated bond.

A solvent to be used when the present active energy beam-curable type resin composition is used in a solution state or applied to a plastic film as a film substrate to form a dry film is a hydrophilic solvent such as alcohols, glycol ethers, glycol esters, etc. Needless to say, appropriate mixtures composed of the hydrophilic solvent as the main component and ketones such as methylethylketone, methylisobutylketone, etc., esters such as ethyl acetate, isobutyl acetate, etc., aromatic hydrocarbons such as toluene, xylene, etc., or their halogen-substituted compounds, and chlorine-containing aliphitic solvents such as chloromethylene, 1,1,1-trichloroethane, etc., if desired, can be also used. These solvents can be also used as a developer for the present resin composition.

The present active energy-curable type resin composition can contain, besides the said photopolymerization initiator and the solvent, such additives as a catalyst for the condensation cross-linking, a heat polymerization inhibitor, a coloring agent (dye and pigment), a particulate filler, a tight adhesion promoter, a plasticizer, etc., if desired.

The catalyst for the condensation cross-linking includes, for example, sulfonic acids typified by paratoluenesulfonic acid, carboxylic acids such as formic acid, etc. The heat polymerization inhibitor includes, for example, hydroquinone and its derivatives, paramethoxyphenol, phenothiazine, etc. The coloring agent includes oil-soluble dyes and pigments are admixed in such a range as not to substantially inhibit the transmission of the active energy beam. The filler includes extenders, fine plastic particles, etc. usually used in paints to improve the hardness, coloring, tight adhesion and mechanical strength of the coating film. As the tight adhesion promoter, a silane coupling agent as an inorganic surface-improving agent and a low molecular surfactant are effective for the present resin composition.

The present active energy beam-curable type resin composition can be used to provide a protective film for glass, an adhesive, or an insulating layer for liquid crystal display devices, or give surface improvements such as transparent coloring, or intransparent coloring, water proof endowment, water repellency endowment, stain resistance endowment, etc. onto a glass plate.

By virtue of its chemical resistance, the present resin composition is useful as a masking material for glass etching or metalizing in electroless copper plating, etc. or as a soldering mask for print circuit boards, etc.

By virtue of its water resistance, the present resin composition is useful for forming fine liquid channels, cooling passages, particularly for forming fluid logical elements.

Furthermore, the present resin composition can also provide a photosensitive solution for screen printing plate applicable to both aqueous and oily liquids or a dry film with an incomparable durability.

The present active energy beam-curable resin composition can be used in the said various applications in the following manner, for example:

(1) by applying the present resin composition to a support to a desired thickness ranging from 1 to 100 μm, evaporating the solvent off the composition as applied, thereby drying it, and exposing the dried composition to an active energy beam, where in case of using a heat-hardening graft copolymer, the support is heated, if necessary, to a temperature of at least 100° for about 5 to about 60 minutes, or (2) by applying the present resin composition to a support to a desired thickness ranging from 1 to 100 μm, then tightly placing a mask pattern having an active energy beam transmission of at least 1% on the composition, exposing the mask to an active energy beam from the above, then developing the resin composition with a developer capable of dissolving the resin composition, thereby removing the resin composition from the unexposed parts, and, if necessary, heating the support to a temperature of at least 100° C. for 5 to 60 minutes.

The thus obtained cured film has not only a distinguished degree of resolution, but also distinguished tight adhesion, mechanical strength, water resistance, and chemical resistance.

The present active energy beam-curable type resin composition has distinguished sensitivity and degree of resolution as a pattern-forming material, and can form a pattern of high density and high degree of resolution. Futhermore, the formed pattern has distinguished tight adhesion, mechanical strength, and chemical resistance as a coating material, and thus can be used as a protective film or a structural member requiring a long durability.

Furthermore, in case of using a curable graft copolymer, an active energy beam-curable type resin composition having particularly distinguished tight adhesion, mechanical strength or chemical resistance can be obtained.

The present invention will be described in detail below, referring to Examples, where parts or % are by weight, unless otherwise particularly mentioned.

EXAMPLE 1

Eighty parts of 2-hydroxyethyl methacrylate and 20 parts of t-butyl acrylate were subjected to radical chain transfer polymerization, using thioglycolic acid as a chain transfer agent and azobisisobutylnitrite as an initiator, whereby oligomers having terminal carboxyl groups were obtained. The oligomers were allowed to react with glycidyl methacrylate, whereby macromonomers having a methacryloyl group at one terminal of the molecular chain were obtained. The macromonomers had a weight-average molecular weight of 2,000 according to the GPC method. Thirty parts of the macromonomers, 50 parts of methyl methacrylate, and 20 parts of dicyclopentenyl methacrylate were subjected to solution polymerization in methyl cellosolve, whereby thermoplastic graft copolymers having a weight-average molecular weight of 60,000 (as will be hereinafter referred to as GP-1) were obtained.

An active energy beam-curable type resin composition having the following composition was prepared according to the present invention, using GP-1:

| | |
|---|---|
| GP-1 | 100 parts |
| Trimethylolpropane triacrylate | 60 parts |
| Epoxy ester 3002 M*[1] | 140 parts |
| Benzophenone | 10 parts |
| Michler's ketone | 5 parts |
| Cryst Violet | 0.3 parts |
| Methyl cellosolve | 350 parts |

*[1]Methacrylic acid ester of epoxy resin made by Kyoei Yushi Kagaku Kogyo K.K., Japan The composition was applied by a bar coater to a Pyrex substrate, 10cm×10cm, which had previously been ultrasonically washed in a washing solution Daiflon (trademark of a product made by Daikin Kogyo K.K., Japan) and dried, to a thickness of about 50 μm as dried. Then, the surface of the composition was laminated with a polyethylene terephthalate film (Lumilar T type) of 16 μm thickness. Then, the resin composition was exposed to a light exposure source for semiconductors "mask alignment apparatus MA-10" (made by Mikasa K.K., Japan) using an ultra-high pressure mercury lamp having a light energy of 12 mW/cm$^2$ on the irradiated surface at a center wavelength of 365 nm through a mask for resolution test for 20 seconds.

After the light exposure, the resin composition was developed with 1,1,1-trichloroethane in an ultrasonic washer for 45 seconds. After the development, the resin composition had such a degree of resolution that a line/-distance pattern at a width of 50 μm was exactly reproduced.

Then, the substrate was dried by heating, and subjected to post-exposure of 10 J/cm². Then, the substrate was subjected to a cross cut tape peeling test using an industrial purpose cellophane tape, and it was found to have a tight adhesion of 100/100 and that the resin composition had a tight adhesion except for clear cross-cut scars.

The substrate was immersed into an aqueous NaOH solution (pH=9.0) and subjected to a pressure cooker test at 121° C. and 2 atm. for 10 hours. After the pressure cooker test, the resin composition was subjected again to the cross-cut tape peeling test and a peeling test of the 50 μm pattern parts. It was found that no decrease in the tight adhesion such as peeling, floating, etc. occurred in both tests. No change in quality such as whitening of the film etc. was found at all.

EXAMPLE 2

Thirty parts of N-methylol methacrylamide and 70 parts of 2-hydroxyethyl methacrylate were subjected to radical chain transfer polymerization, using thioglycolic acid as a chain transfer agent and azobisisobutylnitrite as an initiator, whereby oligomers having terminal carboxyl groups were obtained. By reaction of the oligomers with glycidyl methacrylate, macromonomers having a methacryloyl group at one terminal of the molecular chain were obtained. The macromonomers had a weight-average molecular weight of 1,500 according to the GPC method.

Thirty parts of the macromonomers, 50 parts of methyl methacrylate, and 20 parts of dicyclopentenyl methacrylate were subjected to solution polymerization in methyl cellosolve, whereby heat cross-linkable graft copolymers having a weight-average molecular weight of 65,000 (as will be hereinafter referred to as GP-2) were obtained.

An active energy beam-curable type resin composition having the following composition was prepared according to the present invention, using GP-2.

| | |
|---|---|
| GP-2 | 100 parts |
| Neopentylglycol diacrylate | 60 parts |
| Epoxy ester 3002 M | 140 parts |
| Benzophenone | 10 parts |
| Michler's ketone | 5 parts |
| Crystal violet | 0.3 parts |
| Methyl cellosolve | 350 parts |

A line/distance pattern at a width of 50 μm was formed from the resin composition applied to a thickness of 40 μm onto a Pyrex substrate, 10cm×10cm, in the same manner as in Example 1, and after the evaporation of the developer and drying, the substrate was subjected to post-exposure for 10 minutes, using the same light source, and then to heat treatment at 150° C. for 15 minutes.

The substrate having the thus formed cured pattern was immersed into an aqueous NaOH solution (pH=9.0) and subjected to a pressure cooker test at 121° C. and 2 atm. for 20 hours. After the completion of the test, the substrate was washed with water, dried and subjected to a cross-cut tape peeling test and a peeling test for the pattern part. It was found that the tight adhesion was 100/100 and no peeling occurred at the pattern part.

EXAMPLE 3

Ninety parts of 3-chloro-2-hydroxypropyl methacrylate and 10 parts of N-vinylpyrrolidone were subjected to radical chain transfer polymerization in the same manner as in Examples 1 and 2 to obtain macromonomers having a weight-average molecular weight of about 2,500 and a vinyl group at one terminal of the molecular chain (poly-3-chloro-2-hydroxypropyl methacrylate/N-vinylpyrrolidone). Twenty-five parts of the macromonomers, 20 parts of dicyclopentenyl methacrylate, 45 parts of methyl methacrylate, and 10 parts of dimethylaminoethyl methacrylate were subjected to copolymerization in methylisobutylketone (weight-average molecular weight: 65,000).

Then, 11 parts of a partial urethane compound obtained by the reaction of hexamethylenediisocyanate with the 2-hydroxyethyl moiety of the said copolymer in the ratio of NCO equivalent : OH equivalent=2.0 :1.1 was added to the polymer solution containing 100 parts of the thus obtained copolymers and the mixture was subjected to reaction, whereby 30% of the 3-chloro2-hydroxypropyl methacrylate moiety was acrylurethanized and graft copolymers having photopolymerizable acryl ester groups as side chains (as will be hereinafter referred to as GP-3) were obtained.

An active energy beam-curable type resin composition having the following composition was prepared according to the present invention, using GP-3.

| | |
|---|---|
| GP-3 | 100 parts |
| Trimethylolpropane triacrylate | 30 parts |
| NK ester EPM 800*² | 100 parts |
| Irgacure 651 | 11 parts |
| Crystal violet | 0.2 parts |
| Methylisobutylketone | 300 parts |

*²methacrylic acid ester of epoxy resin made by Shin-Nakamura Kagaku K.K., Japan The composition was applied by a bar coater onto a silicon wafer having an oxide film of SiO₂ on the surface to a thickness of 50 μm as dried. Then, a pattern for a resolution test was formed therefrom in the same manner as in Example 1. The formed pattern exactly reproduced a line/distance pattern at a width of 50 μm. Then, the silicon wafer was dried by heating and subjected to post-exposure at 10 J/cm² with the same ultraviolet light source as used in the pattern-exposure.

The silicon wafer was subjected to a cross-cut tape peeling test, and it was formed that no peeling of the coating film occurred at all.

Then, the silicon wafer was immersed in an aqueous NaOH solution (pH=9.0) and subjected to a pressure cooker test at 121° C. and 2 atm. for 20 hours. After the completion of the test, the silicon wafer was subjected again to the cross-cut tape peeling test and to the peeling test of pattern part, and it was found that no decrease in the tight adhesion such as peeling, floating, etc. was observed at all in both tests.

EXAMPLE 4

Seventy parts of butoxymethyl acrylamide and 30 parts of 2-hydroxyethyl methacrylate were subjected to radical chain transfer polymerization in the same manner as in Examples 1 and 2 to obtain macromonomers having a weight-average molecular weight of about 3,000 and a vinyl group at one terminal of the molecular chain (poly-butoxymethyl-acrylamide/2-hydroxyethyl methacrylate).

Twenty-five parts of the thus obtained macromonomers, 55 parts of methyl methacrylate, 15 parts of dicyclopentenyl methacrylate, and 5 parts of acrylonitrile were subjected to polymerization in methyl cellosolve to obtain heat cross-linkable graft copolymers having a weight-average molecular weight of 65,000 (as will be hereinafter referred to as GP-4).

An active energy beam-curable type resin composition having the following composition was prepared according to the present invention, using GP-4.

| | |
|---|---|
| GP-4 | 100 parts |
| Acrylic acid ester of triglycidyl ether of trimethylolpropane | 100 parts |
| Urethane acrylate 11R4003*[3] | 100 parts |
| Copper phthalocyanine | 15 parts |
| Paratoluenesulfonic acid | 3 parts |
| Irgacure 651 | 15 parts |
| Methyl cellosolve | 300 parts |

*[3]urethane acrylate made by Nagase Kasei K.K., Japan

A one % γ-mercaptopropyltrimethoxysilane in ethanol as a silane coupling agent having a thiol group was applied to a Pyrex glass plate, 10cm×10cm, by a spinner at 2,500 rpm for 25 seconds, and then the glass plate was subjected to a heat treatment at 120° C. for 10 minutes.

A mill dispersion of the said resin composition was applied to a 16 μm-thick polyethylene terephthalate film by wire bar and dried at 100° C. for 20 minutes, whereby a layer of the resin composition having a film thickness of 10 μm was formed therein. Then, the said Pyrex glass plate was laminated with the thus obtained film by a laminator HRL-24 (trademark of a product made by DuPont) at 120° C. and a peripheral speed of 1 m/min.

A blue-colored, clear line/distance pattern at a width of 25 μm could be formed therefrom in the same manner as in Example 1. Then, the plate was subjected to post-exposure at 10 J/cm² and heat treatment at 150° C. for 15 minutes to conduct complete curing.

The thus formed pattern was subjected to a pressure cooker test under the same conditions as in Example 1 to investigate the tight adhesion. After the pressure cooker test, no peeling of the coating film was observed at all by the cross-cut tape peeling test. Comparative Test.

Methyl methacrylate, 2-hydroxyethyl methacrylate, and butyl acrylate in a molar ratio of 60:30:10 were subjected to polymerization in methylisobutylketone to obtain thermoplastic linear polymers having a weight-average molecular weight of 88,000 (as will be hereinafter referred to as LP-1).

An active energy beam-curable resin composition was prepared in the same manner as in Example 1 except that LP-1 was used in place of GP-1, and a pattern was formed. The thus obtained pattern had substantially the same degree of resolution as in Example 1, but in the pressure cooker test, the pattern was peeled from the substrate before the start of the peeling test, and the water resistance and the tight adhesion were found to be poor.

As is obvious from the foregoing Examples and Comparative Example, the active energy beam-curable resin composition according to the present invention can form a pattern with a high degree of resolution, a high tight adhesion to a support, and distinguished heat resistance, mechanical strength, and chemical resistance.

We claim:

1. An active energy beam-curable type resin composition, which comprises (A) a graft copolymer comprising a main chain including structural units containing both a monomer containing one (meth)acryloyl group and a dicyclopentenyl derivative group represented by the following general formula (I):

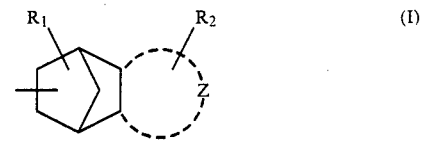

where Z represents a five-membered ring given by or, and $R_1$ $R_2$ represent hydrogen atoms or alkyl groups having 1 to 3 carbon atoms, in one molecule, and at least one monomer selected from the group consisting of alkyl(meth)acrylate, acrylonitrile, and styrene, and side chains comprising units prepared from at least one monomer selected from the group consisting of (a) hydroxyl group-containing (meth)acryl monomer, (b) amino or alkylamino group-containing (meth)acryl monomer, (c) carboxyl group-containing (meth)acryl or vinyl monomer, (d) N-vinylpyrrolidone, (e) vinylpyridine or its derivatives, and (f) a (meth)acrylamide derivative represented by the following general formula (II), as added to the main chain:

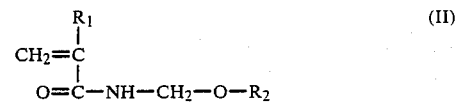

wherein $R_1$ represents a hydrogen atom or a methyl group, and $R_2$ represents a hydrogen atom or a hydroxyl group-containing alkyl having 1 to 4 carbon atoms or acyl group; and (B) a monomer having an ethylenic unsaturated bond.

2. An active energy beam-curable type resin composition according to claim 1, wherein 20 to 80 parts by weight of the graft copolymer (A) and 80 to 20 parts by weight of the monomer having an ethylenic unsaturated bond (B) are contained in the resin composition.

3. An active energy beam-curable type resin composition according to claim 1, wherein 0.1 to 20 parts by weight of a photopolymerization initiator is further contained on the basis of 100 parts by weight of total of the graft copolymer (A) and the monomer having an ethylenic unsaturated bond (B).

4. An activating energy beam-curable type resin composition according to claim 1, wherein 1 to 30% by weight of the monomer represented by the general formula (I) is contained in the graft copolymer (A).

5. An active energy beam-curable type resin composition according to claim 1, wherein said monomer having an ethylenic unsaturated bond has a boiling point of 100° C. or higher under the atmospheric pressure and at least two ethylenic unsaturated bonds.

6. An active energy beam-curable type resin composition according to claim 1, wherein a photopolymerizable monomer is added to some of side chains of said graft copolymers.

7. An active energy beam-curable type resin composition according to claim 1, wherein a hydrophobic monomer is contained within the range of 0 to about 25% by weight as a component of comonomers in said graft copolymer.

8. An active energy beam-curable type resin composition according to claim 1, wherein said graft copolymer has a weight-average molecular weight of about 5000 to about 300,000.

9. An active energy beam-curable type resin composition according to claim 1, wherein a photopolymerization initiator is contained in the resin composition.

10. An active energy beam-curable type resin composition according to claim 9, wherein said photopolymerization initiator is a compound selected from the group consisting of benzoin alkyl ethers, benzophenones, anthraquinones, xanthones, and acetophenones.

11. An active energy beam-curable type resin composition according to claim 9, wherein a photopolymerization promotor is contained in the resin composition.

12. An active energy beam-curable type resin composition according to claim 11, wherein said photopolymerization promotor is an amino compound.

13. An active energy beam-curable type resin composition according to claim 1, wherein an additive selected from the group consisting of catalysts for the condensation cross-linking, heat polymerization inhibitors, coloring agents, particulate fillers, tight adhesion promotors, and plasticizers is contained in the resin composition.

14. An active energy beam-curable type resin composition according to claim 13, wherein said catalyst for condensation cross-linking is selected from the group consisting of sulfonic acids and carboxylic acids.

15. An active energy beam-curable type resin composition according to claim 13, wherein said heat polymerization inhibitor is selected from the group consisting of hydroquinone and its derivatives, paramethoxyphenol, and phenothiazine.

16. An active energy beam-curable type resin composition according to claim 13, wherein said coloring agent is selected from the group consisting of oil-soluble dyes and pigments.

17. An active energy beam-curable type resin composition according to claim 13, wherein said particulate filler is selected from the group consisting of extenders and fine plastic particles.

18. An active energy beam-curable type resin composition according to claim 13, wherein said tight adhesion promotor is selected from the group consisting of silane coupling agents and low molecular surfactants.

* * * * *

UNITED STATES PATENT AND TRADEMARK OFFICE
CERTIFICATE OF CORRECTION

PATENT NO. : 4,839,399
DATED : June 13, 1989
INVENTOR(S) : YASUFUMI SATO, ET AL.

Page 1 of 2

It is certified that error appears in the above-identified patent and that said Letters Patent is hereby corrected as shown below:

IN [57] ABSTRACT

"form" should read --from--.

COLUMN 2

Line 23, "(meth)acryl" should read --(meth)acryl monomer,--.
Line 55, "in" should read --is--.

COLUMN 3

Line 42, "ration" should read --ratio--.

COLUMN 4

Line 3, "5-hydroxpentyl(meth)acrylate," should read --5-hydroxypentyl(meth)acrylate,--.

COLUMN 6

Line 42, "gormula" should read --formula--.

COLUMN 7

Line 5, "M-6200, M-6300," should read --M-6200, M-6250, M-6300,--.
Line 17, "groupcontaining" should read --group-containing--.
Line 22, "trimethylolpropanemodified" should read --trimethylolpropane-modified--.
Line 42, "hydrroxypropyl" should read --hydroxypropyl--.

and $R_2$--.

UNITED STATES PATENT AND TRADEMARK OFFICE
CERTIFICATE OF CORRECTION

PATENT NO. : 4,839,399
DATED : June 13, 1989
INVENTOR(S) : YASUFUMI SATO, ET AL.

Page 2 of 2

It is certified that error appears in the above-identified patent and that said Letters Patent is hereby corrected as shown below:

COLUMN 9

Line 55, "100°" should read --100°C.--.

COLUMN 12

Line 25, "chloro2-hydroxypropyl" should read --chloro-2-hydroxypropyl--.

COLUMN 14

Line 17, "by or," should read --by  or ,--.

Line 18, "and $R_1$ $R_2$" should read --and $R_1$ and $R_2$--.

Signed and Sealed this

Seventeenth Day of April, 1990

Attest:

HARRY F. MANBECK, JR.

*Attesting Officer*   *Commissioner of Patents and Trademarks*